United States Patent [19]

Bronner et al.

[11] Patent Number: 5,321,647
[45] Date of Patent: Jun. 14, 1994

[54] SEMICONDUCTOR MEMORY DEVICE AND OPERATIONAL METHOD WITH REDUCED WELL NOISE

[75] Inventors: Gary B. Bronner, Mount Kisco; Sang H. Dhong, Mahopac, both of N.Y.

[73] Assignee: International Business Machines Corp., Armonk, N.Y.

[21] Appl. No.: 879,822

[22] Filed: May 7, 1992

[51] Int. Cl.$^5$ .............................................. G11C 7/00
[52] U.S. Cl. .............................. 365/149; 365/189.09; 365/226
[58] Field of Search .................. 365/189.09, 226, 149; 307/296.1, 296.2, 296.4, 534

[56] References Cited

U.S. PATENT DOCUMENTS

| | | | |
|---|---|---|---|
| 4,312,047 | 1/1982 | Donoghue | 365/189 |
| 4,602,355 | 7/1986 | Watanabe | 365/206 |
| 4,670,861 | 6/1981 | Shu et al. | 365/189.09 |
| 4,903,344 | 2/1990 | Inoue | 365/51 |
| 4,916,666 | 4/1990 | Fukuhama et al. | 365/207 |
| 4,943,949 | 7/1990 | Yamaguchi et al. | 365/206 |
| 4,958,325 | 9/1990 | Nakagome et al. | 365/206 |
| 4,977,542 | 12/1990 | Matsuda et al. | 365/207 |
| 5,022,000 | 6/1991 | Terasawa et al. | 365/189.11 |
| 5,177,586 | 1/1993 | Ishimura et al. | 365/189.09 |

*Primary Examiner*—Eugene R. LaRoche
*Assistant Examiner*—Frank Niranjan
*Attorney, Agent, or Firm*—Heslin & Rothenberg

[57] ABSTRACT

A semiconductor memory device and operational method having reduced well noise are provided. The memory device includes a plurality of memory cells arranged in rows and columns within an array well and addressable by a plurality of word lines and bit lines. The array well is biased to a desired potential and a sense amplifier is employed to read bit line states during a predefined bit line signal development period. Array well biasing is removed during at least a portion of this signal development, so that the well potential floats (ideally remaining stable) as signals are being developed on the bit lines. This temporary, floating well technique is particularly important for open bit line architectures.

21 Claims, 8 Drawing Sheets

SEMICONDUCTOR MEMORY DEVICE AND OPERATIONAL METHOD WITH REDUCED WELL NOISE

BACKGROUND OF INVENTION

1. Technical Field

The present invention relates in general to semiconductor memory devices and their operation, and more particularly, to a dynamic random access memory (DRAM) structure and operational method with reduced well noise characteristics, especially when configured as an open bit line memory array. However, the technique described herein is generally applicable to any known memory device technology.

2. Background Art

Dynamic-type semiconductor memory devices (DRAMs) are well known. A partial block diagram of a DRAM structure is shown in FIG 1. The structure comprises a memory array 10 including a plurality of memory cells 12, which function as the memory elements, arranged in rows and columns. In this embodiment, each memory cell 12 includes a NFET 14 having its source "S" coupled to a first terminal of a capacitor "C", the second terminal of which is connected to ground. Each row of the plurality of memory cell rows is connected to a word line, with a plurality of word lines "WL1, WL2, ..." being provided. The word lines are connected to each memory cell through the gate "G" of the respective NFETs 14. Each column of the plurality of memory cell columns is interconnected by one of a plurality of bit lines "BL1, BL2, BL3...," with each bit line being connected to each memory cell in the column through the drain "D" of the respective NFETs 14. The intersections of the word lines are connected to a row decoder (not shown) and the bit lines are connected to a column decoder (not shown). These word lines and bit lines form a matrix definitive of the memory array.

Upon receipt of an externally applied row address signal and a column address signal, a particular memory cell is selected which is at the intersection of the word line and the bit line identified by the row decoder and the column decoder, respectively. Information is read from or (written into) the memory cell through an input/output interface portion, including a sense amplifier 16 connected to bit lines "BL1, BL2, BL3, ...". More specific details on the architecture and operation of semiconductor memory array structures in general, and DRAMS in particular, can be ascertained from the open literature.

Examples of two DRAMs which are widely understood are separately depicted in FIG. 2 and FIG. 3. FIG. 2 shows an open bit line DRAM configuration, generally denoted 20, in which corresponding halves of paired bit lines "BL1, BL1', BL2, BL2', BL3, BL3'... BLY, BLY'" extend in opposite directions from a sense amplifier 26 formed of a plurality of flip-flops, one flip-flop 28 of which is shown by way of example as receiving signals from bit line BL3 and paired bit line "BL3'." Each word line WL1, WL2, etc. intersects only one-half, of the bit line pairs. For example, word line WL1 intersects bit lines "BL1, BL2, BL3, ... BLY." Input/output lines (data bus lines) also intersect each bit line pair and are connected to respective halves through appropriate switches (not shown) controlled by a column decoder. Further, a reference word line signal "WL(REF), WL(REF)'" is shown to intersect each set of bit lines extending from one side of amplifier 26.

Each memory array, generally denoted 22 and 24, is conventionally disposed within an array well, 23 and 25, respectively, to reduce the effects of substrate generated noise on bit line signals to be sensed. Typically, each array well 23 and 25 is maintained at a predefined potential by a well potential generator (not shown) which, in an attempt to insure potential uniformity throughout the well, is commonly coupled to the well at a plurality of locations. Open bit line memory structures are potentially important because they comprise the densest possible memory array configuration, since a memory cell can be disposed at each X, Y intersection. However, an open bit line architecture is inherently imbalanced and sensitive to induced noises. One significant component of this noise problem arises from the unequalized effects of substrate noise on bit line pairs in adjacent but separate array wells. Because associated memory arrays are disposed in separate memory wells, potential variations in one well capacitively couple to only one half of a bit line pairing. Due to this inherent imbalance, open bit line architectures have not heretofore been commonly used in commercially manufactured memory devices.

One popular alternative to an open bit line structure is depicted in FIG. 3. This figure shows a folded bit line DRAM configuration, generally denoted 30, in which the different halves of each bit line pair "BL1, BL1', BL2, BL2', BL3, BL3', ... BLY, BLY'" extend in the same direction from a sense amplifier 32. The configuration is advantageous in that a single array is defined on one side of the sense amplifier 32 so that the entire array can reside within a single array well. Thus, more uniform accounting for common mode noise is possible. A folded bit line configuration is commonly used in DRAMs of, for example, 256 Kbits or 1 Mbits. However, folded bit line architectures are inherently limited in the degree of integration obtainable within a defined area. Since a folded memory array does not allow the disposition of a memory cell at each bit line, word line intersection, the configuration is less dense than an open bit line memory structure.

With continuing advancement towards higher and higher integration, the open bit line configuration is drawing significant attention throughout the semiconductor memory industry, especially in relation to 16 Mbit, 64 Mbit, and beyond, memories. Thus, a genuine need exists in the semiconductor memory art for a more dense memory array architecture than a folded bit line structure, which has performance characteristics similar to those obtainable with a conventional folded bit line memory device.

DISCLOSURE OF INVENTION

Briefly summarized, an operational method for a semiconductor memory device having a plurality of memory cells arranged in rows and columns within an array well is provided. The memory device includes a plurality of periodically spaced bit lines and a plurality of periodically spaced word lines for performing column and row selection of memory cells, respectively. The operational method includes the steps of: biasing the array well to a desired potential; performing row selection of the plurality of memory cells by selecting a word line from the plurality of periodically spaced word lines; allowing signals to develop on the plurality of bit lines while at least partially contemporaneously removing the biasing well potential and allowing the array well potential to float; and sensing the bit line signals subsequent bit line signal development. Further specific details of the operational method are also described and claimed herein.

In another aspect, a biasing method for a semiconductor memory array having a plurality of memory cells disposed within an array well is provided. The array includes a plurality of bit lines for sensing the state of selected memory cells. The method comprises a technique for biasing the array well so as to minimize noise on the bit lines during bit line signal development, and includes the steps of: biasing said array well to a desired potential; and at least partially contemporaneously with bit line signal development, discontinuing array well biasing and allowing the array well potential to float as bit line signals develop.

In still another aspect, the present invention comprises a semiconductor memory device having a plurality of memory cells arranged in rows and columns within an array well. A plurality of periodically spaced, vertically extending bit lines are coupled to the memory cells for performing column selection thereon and a plurality of periodically spaced horizontally extending word lines are provided for performing row selection of memory cells. Biasing means is connected to the well for biasing the well to a desired potential. A sense amplifier is connected to at least some of the plurality of bit lines for sensing the states of corresponding ones of the plurality of memory cells during a predefined bit line signal development period. Pursuant to the invention, disconnecting means is employed to isolate the well biasing means from application to the array well during at least a portion of the bit line signal development period so that the well potential floats (and thereby remains substantially fixed).

To summarize, a novel semiconductor memory device and operational method having reduced well noise are provided. Common mode noise reduction is accomplished by floating the array well potential during bit line signal development so that the well potential remains substantially fixed, thereby not interfering with signal development. The technique can be readily incorporated into most any memory array design/technology, but especially impressive noise reduction benefits are experienced when used in combination with DRAM structures, particularly DRAM structures having an open bit line configuration.

BRIEF DESCRIPTION OF DRAWINGS

These and other objects, advantages and features of the present invention will be more readily understood from the following detailed description of certain preferred embodiments thereof, when considered in conjunction with the accompanying drawings in which.

BEST MODE FOR CARRYING OUT THE INVENTION

As noted above, the inventive technique employed by the novel semiconductor memory device and operational method disclosed herein is to float the array potential well during bit line sensing, thereby allowing the well potential to remain substantially stable and significantly alleviating common mode signal loss, particularly in open bit line architectures. By way of comparison, one simplified embodiment of a conventional DRAM read operation is set forth in FIG. 4. Traditionally, an array well is connected directly to a well generator, 40 "Array Well Biased to Desired Potential." This well biasing potential remains continuously applied throughout a read cycle operation in order to minimize capacitive coupling noise on the bit lines by eliminating voltage variations throughout the array well.

Figure 4:
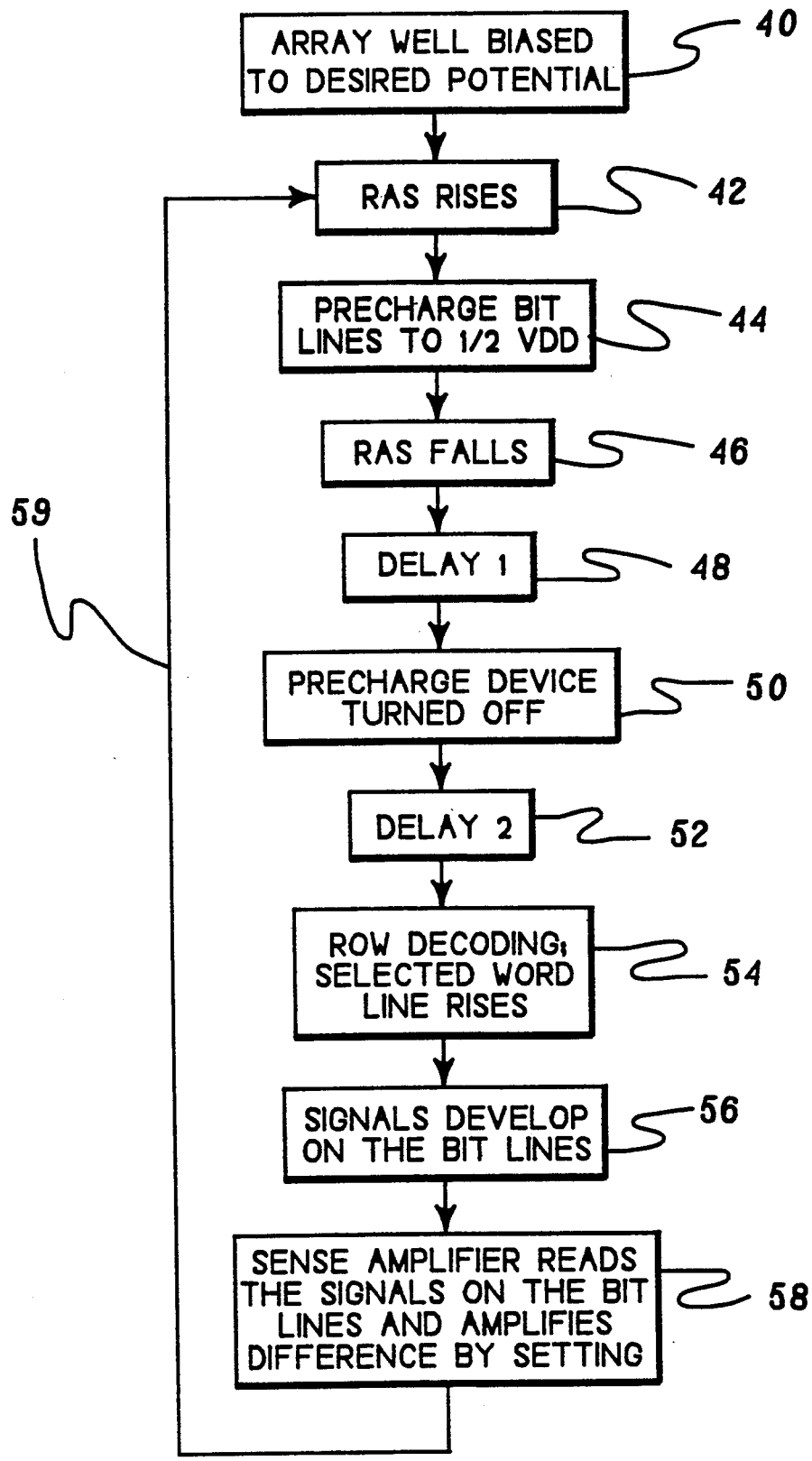
FIG. 4 is a flowchart of a conventional memory array processing embodiment.
Figure 5:
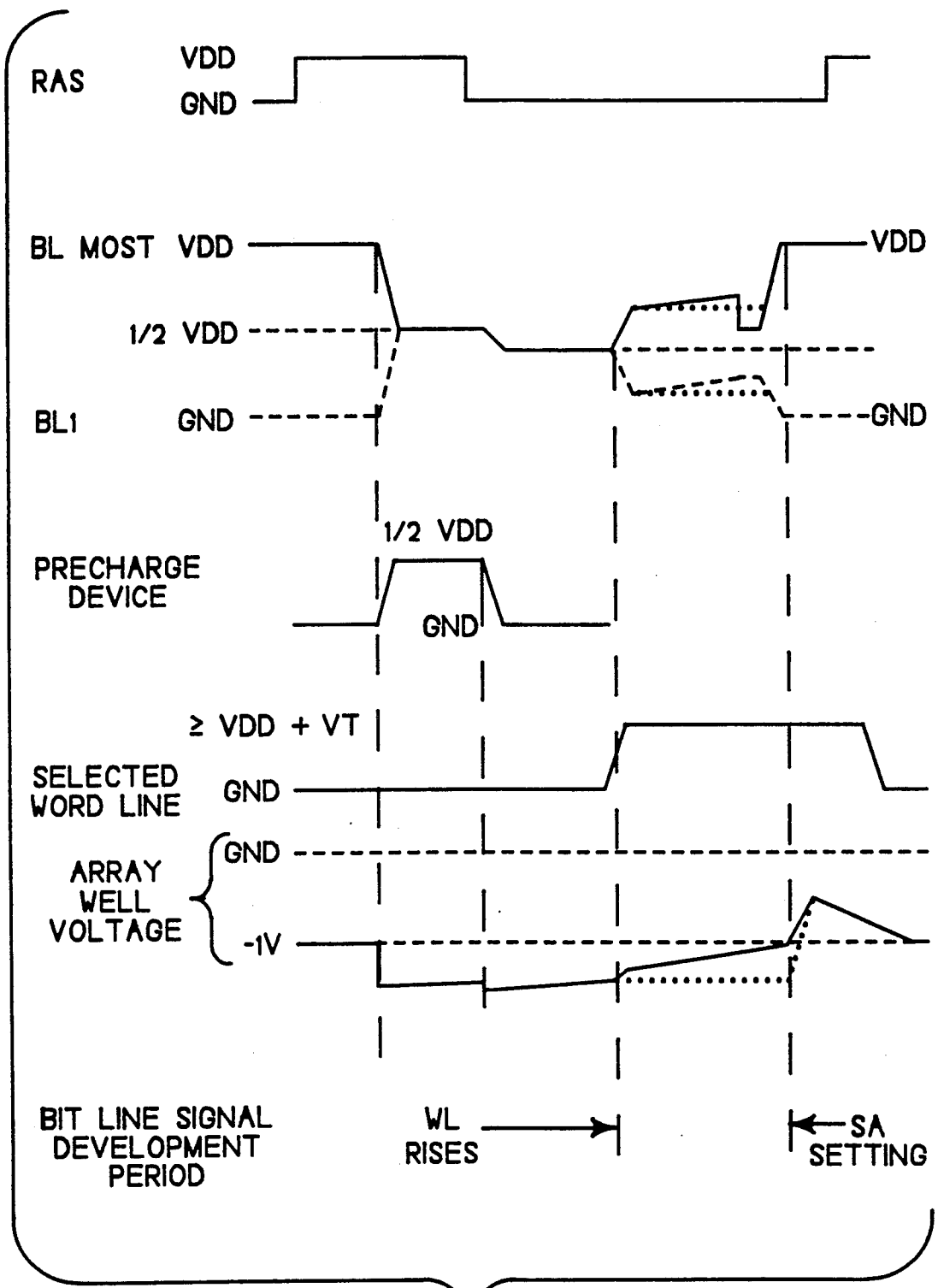
FIG. 5 is an exemplary timing diagram for conventional memory array processing and for memory array processing pursuant to the present invention.

The rising edge of a row address strobe (RAS) (see FIG. 5) is assumed to initiate a sensing cycle, 42 "RAS Rises" (FIG. 4). (Further, the example discussed herein is assumed to comprise a DRAM cell with an NMOS access transistor in a P-type array well.) Thereafter, the bit lines are precharged to a predefined value, for example, one half VDD, 44 "Precharge Bit Lines to ½ VDD." This operation is depicted in FIG. 5 wherein most of the bit lines are assumed to contain a VDD voltage signal, while an arbitrary bit line "BL1" is shown to contain a ground potential. Thereafter, the row address strobe (RAS) falls, 46 "RAS Falls" and, subsequent a predetermined time interval, 48 "Delay 1," the bit line precharging device is disconnected, 50 "Precharge Device Turned Off" to allow the bit lines to float. This switching off results in a slight drop in bit line potential, which is shown in FIG. 5.

The next important occurrences in the sensing cycle are row decoding and the provision of a rising signal on a selected word line, 54 "Row Decoding; Selected Word Line Rises," which typically occur after a predefined time interval, 52 "Delay 2," subsequent removal of the precharge device signal. The selected word line rises to a voltage greater than or equal to VDD plus the threshold voltage of the NMOS device controlling turn-on of the line. As shown in FIG. 5, rising of a selected word line initiates a time interval or period referred to herein as the "bit line signal development period," 56 "Signals Develop on the Bit Lines."

Figure 1:
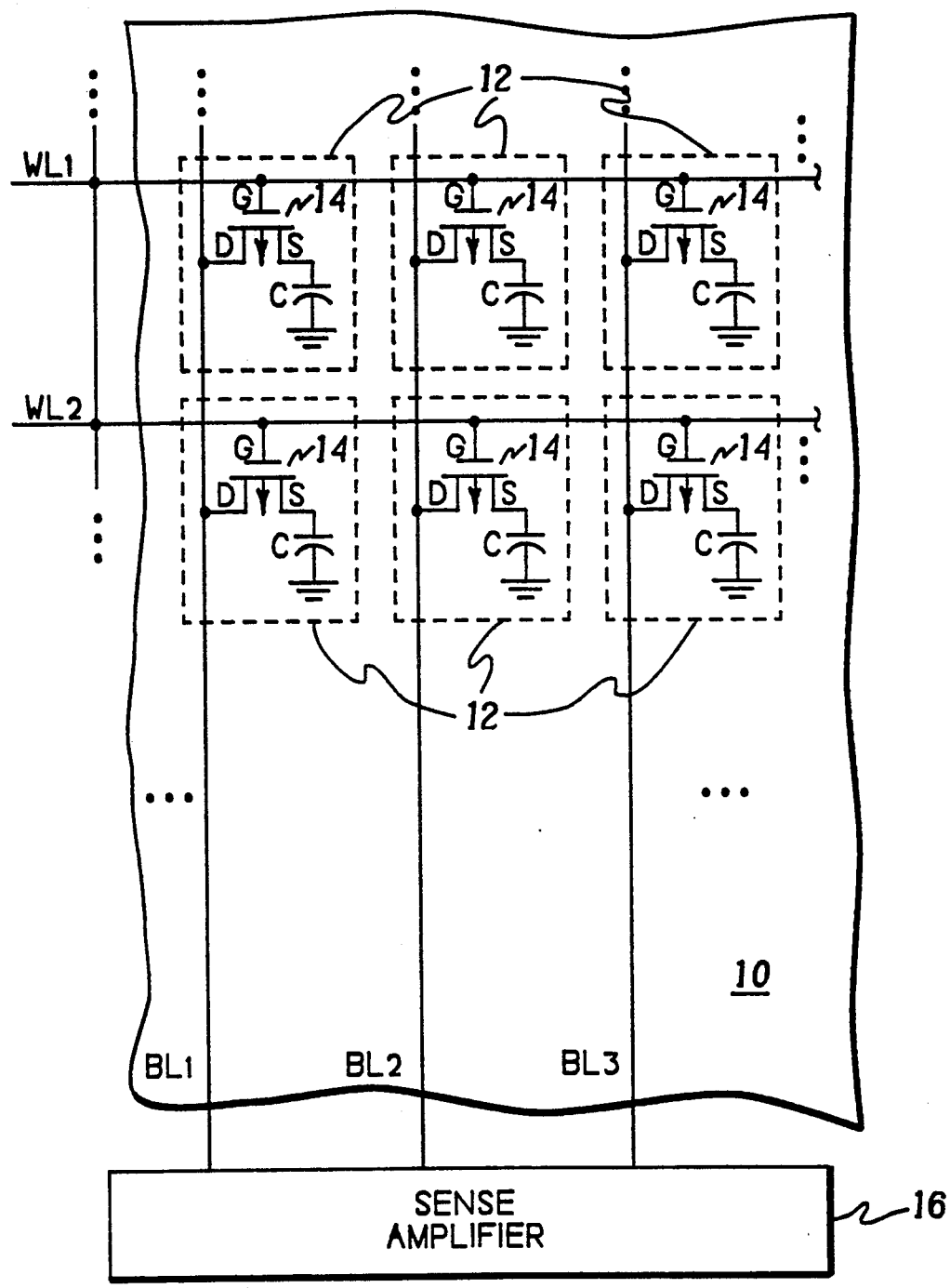
FIG. 1 is a partial schematic of a conventional DRAM structure.
Figure 2:
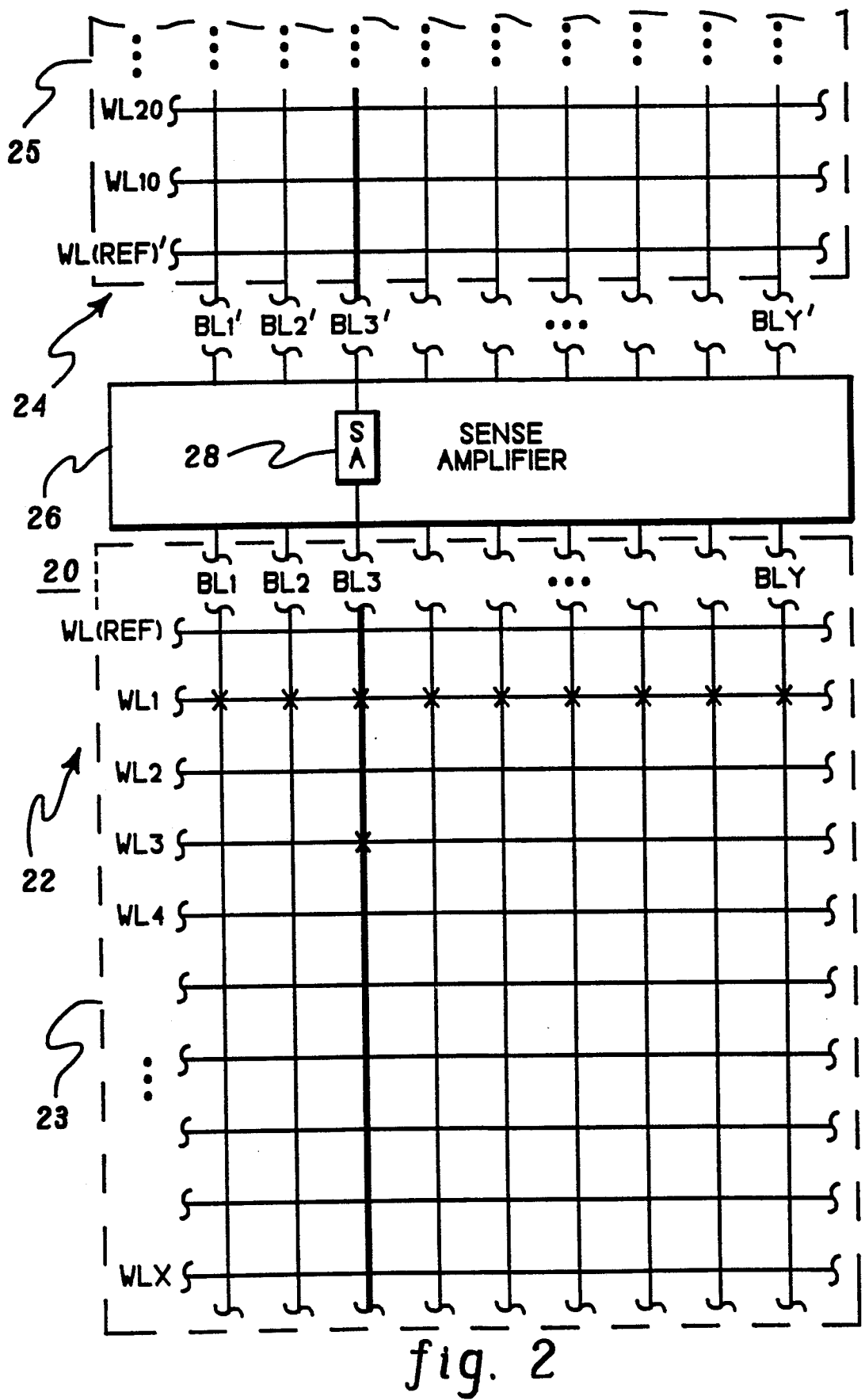
FIG. 2 is a partial schematic of an open bit line memory array architecture.
Figure 3:
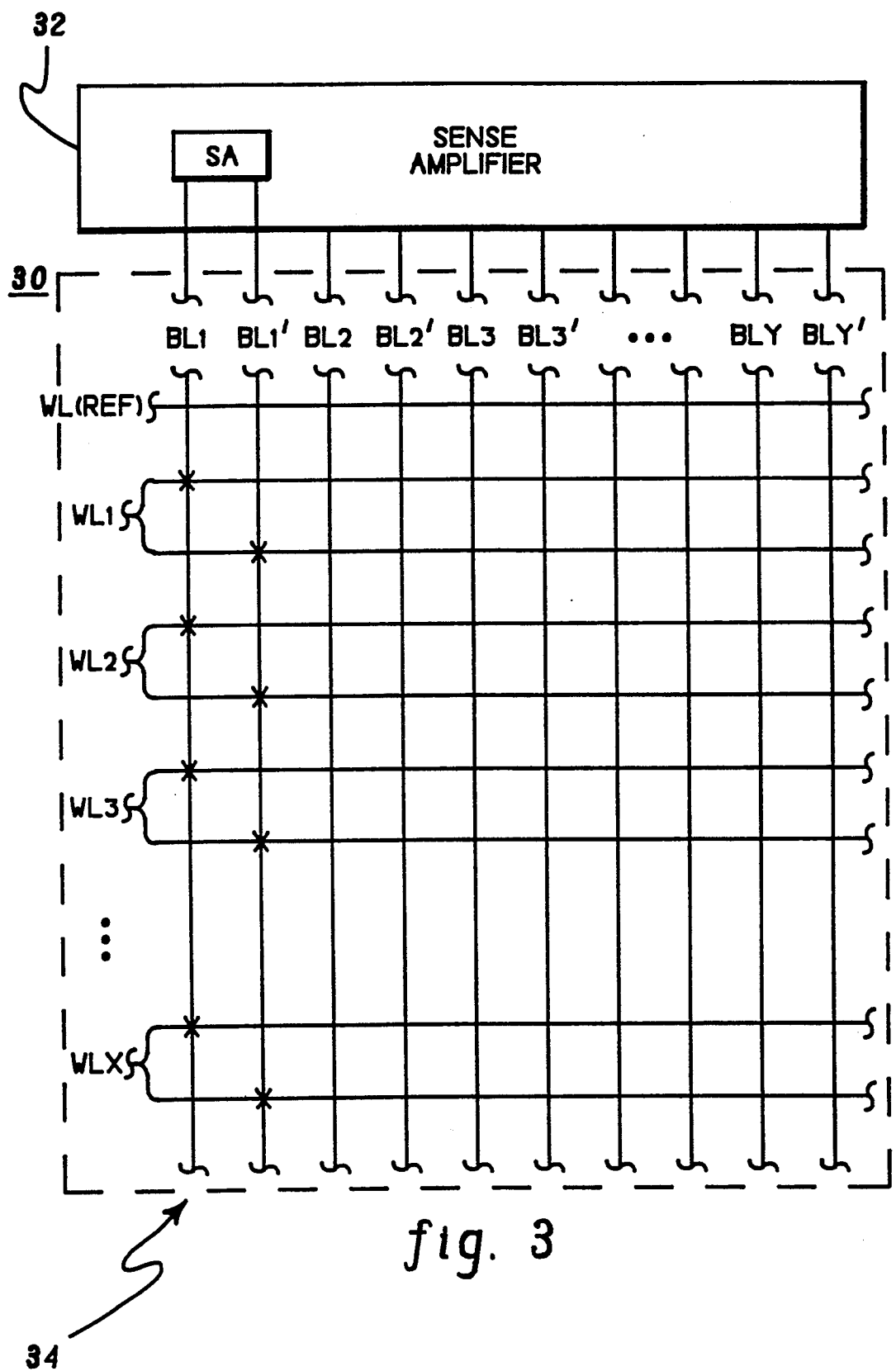
FIG. 3 is a partial schematic of a folded bit line memory array architecture.

Once signals are sufficiently developed, the sense amplifier reads signals on paired bit lines (e.g., "BL1" and "BL1'" for "WL1" and "WL(Ref)'" in FIG. 2) and amplifies any sensed difference by setting to a high logic level or a low logic level an output signal from one of the multiple flip-flops, 58 "Sense Amplifier Reads the Signals on the Bit Lines and Amplifies Difference by Setting." Setting of the amplifier terminates the "bit line signal development period" (FIG. 5). After the sense amplifier has been set, the read operation is complete and the memory array controller returns (via loop 59) to repeat the process, i.e., await a next rise in the RAS signal.

As shown in FIG. 5, during conventional operation of a memory array, well voltage (for example, minus 1 volts) will experience a number of changes at different stages of a sensing cycle due to differing signals appearing on the word lines and/or bit lines. Important to the present invention, however, is the recognition that the well voltage continues to attempt recovery throughout bit line signal development, i.e., gradually progress towards a desired minus 1 volt potential. A changing well voltage capacitively couples as noise to the signals being developed on the bit lines during signal development. Thus, increasing well voltage is superimposed on the bit line signal value for both a high signal state and a low signal state. It should be understood from FIG. 5, therefore, that for low signal development the increasing well voltage will operate counter to the signal. This capacitively coupled inaccuracy can result in incorrect latching of one or more sense amplifier flip-flops.

Figure 6:
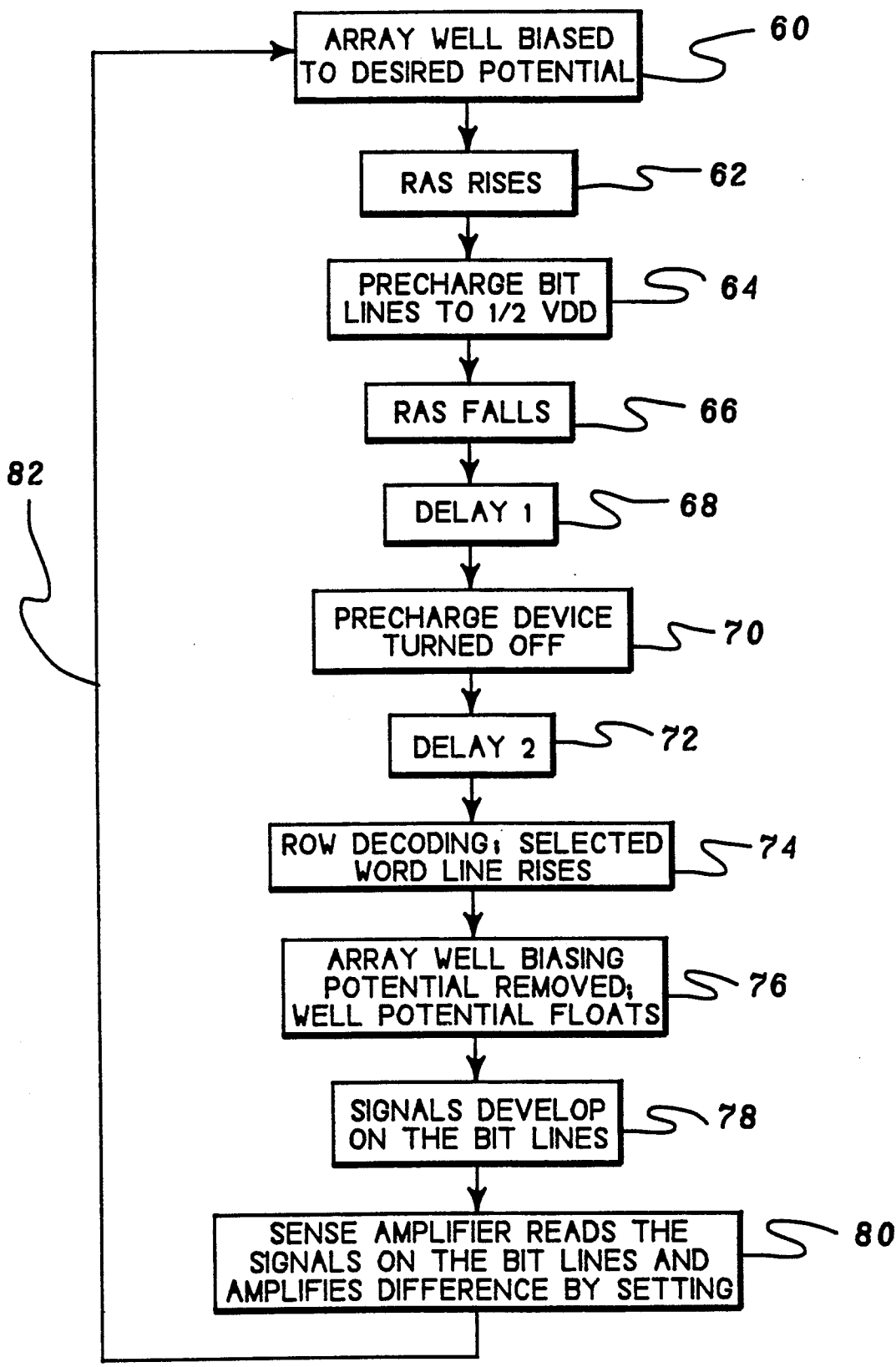
FIG. 6 is a flowchart of a memory array processing embodiment pursuant to the present invention.

One preferred operational embodiment of a memory array pursuant to the present invention is set forth in FIG. 6. In this embodiment, array well potential is initially set, 60 "Array Well Biased to Desired Potential," after which a rising row address strobe (RAS) signal is received, 62 "RAS Rises." Continuing, bit lines are preferably equalized, e.g., to approximately one half VDD, 64 "Precharge Bit Lines to ½ VDD," the row address strobe falls, 66 "RAS Falls" and after a predetermined delay, 68 "Delay 1," the precharge device is removed from the bit lines, 70 "Precharge Device Turned Off."

After a further predetermined delay interval, 72 "Delay 2," row decoding is complete and the signal on a selected word line rises, 74 "Row Decoding; Selected Word Line Rises." Commensurate with the selected word line rising, the array well biasing potential is removed and the well potential is allowed to float, 76 "Array Well Biasing Potential Removed; Well Potential Floats." Floating of the well potential is at least partially simultaneous with signal development on the bit lines, 78 "Signals Develop On the Bit Lines." However, array well potential is preferably floated for the entire bit line signal development period in order to minimize capacitive coupling effects. Once sufficiently developed, the sense amplifier reads the signals on the bit lines and amplifies the respective difference signals by latching to either a high level or a low level, 80 "Sense Amplifier Reads the Signals on the Bit Lines and Amplifies Difference by Setting." After sense amplifier setting, the memory cells are reset and array processing loops back (via 82) to resume array well biasing at the desired potential.

Figure 7:
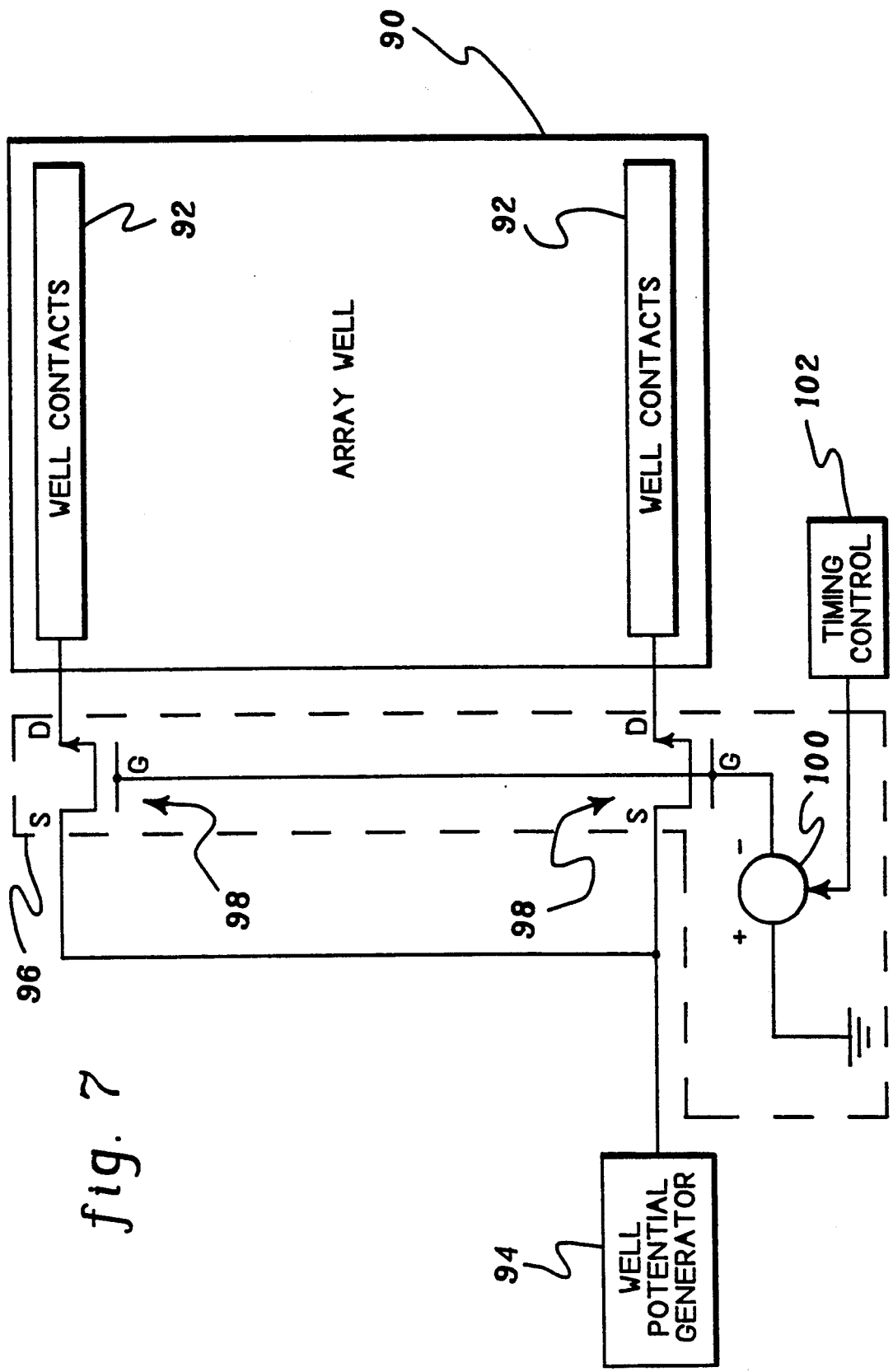
FIG. 7 is a partial schematic of one embodiment of a semiconductor memory device pursuant to the present invention.

FIG. 7 depicts one layout embodiment of a memory device pursuant to the present invention. A memory array well 90 contains multiple contacts 92, each of which is coupled to a well potential generator 94. A switching mechanism, generally denoted 96, is disposed between contacts 92 and generator 94. Mechanism 96 includes multiple NMOS switching transistors, each of which has its source "S" connected to generator 94, drain "D" to contact 92, and gate "G" to a control signal generator 100.

Transistors 98 are gated by a high/low signal from control signal generator 100, which employs available timing and control signals 102. For example, in conventional memory arrays, rising of the word line select and setting of a sense amplifier are both readily available timing events which can be used to gate the isolating devices. Thus, array well 90 potential can be readily floated during bit line signal development in a read cycle by pulling down the gate signal to transistors 98, preferably from a time just before floating of the bit lines. The access device is turned on and a differential bit line signal develops. Once the sense amps latch, the area array well is reconnected to the well generator to limit noise effects.

Figure 8:
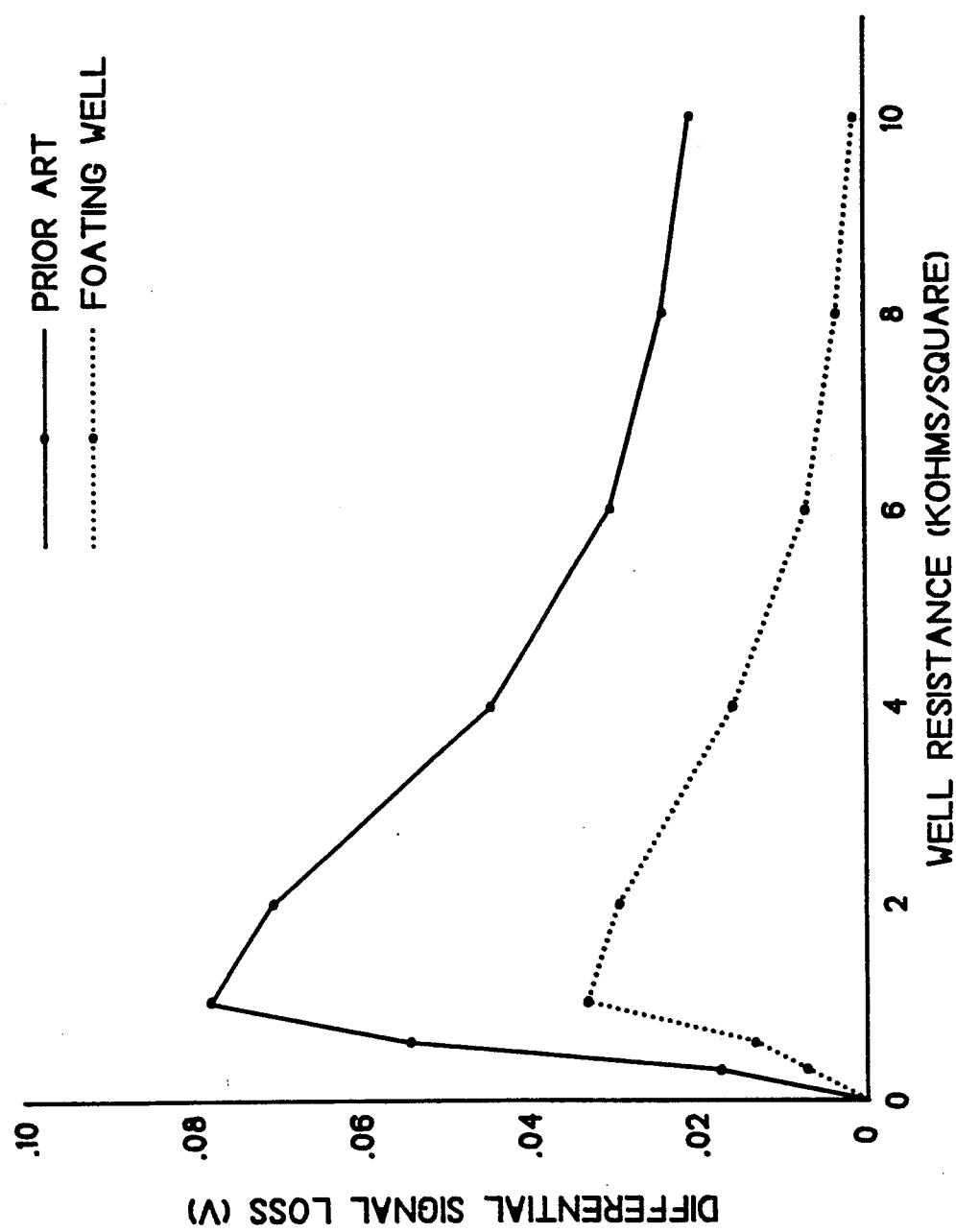
FIG. 8 is graphical comparison of differential signal loss versus memory array well resistance for a conventional memory array process and for a memory array process pursuant to the present invention using a floating well potential during bit line signal development.

FIG. 8 provides a comparison of differential signal loss versus well resistance for a semiconductor memory device operated pursuant to the conventional (constant well bias) technique and a semiconductor memory device operated with a periodically floating well pursuant to the present invention. Floating of the well provides less coupling to the bit lines, and thus improves bit line signal development. FIG. 8 clearly shows less sensitivity of the bit line signal to well resistance. Further, there is much less difference between read high level sensitivity and read low level sensitivity. Improvement in signal development is consistent across the entire range of well resistances. Compared to the conventional method, where the well is directly and continuously connected to the well generator, the selectively floated well reduces differential signal loss by more than a factor of two over a wide range of well resistances.

From the above description it will be recognized that a novel semiconductor memory device and operational method having reduced well noise are set forth. Common mode noise reduction is accomplished by floating the array well potential during bit line signal development so that the well potential remains substantially stable. The technique can be readily incorporated into any memory array design or technology, but the most significant noise reduction benefits are attained in combination with DRAM structures, particularly open bit line DRAM architectures.

While the invention has been described in detail herein in accordance with certain preferred embodiments thereof, many modifications and changes therein may be affected by those skilled in the art. Accordingly, it is intended by the appended claims to cover all such modifications and changes as fall within the true spirit and scope of the invention.

We claim:

1. In a semiconductor memory array having a plurality of memory cells arranged in rows and columns within an array well, and including a plurality of periodically spaced bit lines for performing column selection of memory cells and a plurality of periodically spaced word lines for performing row selection of memory cells, a memory array sensing method comprising the steps of:
   (a) biasing said array well to a desired potential;
   (b) performing row selection of said plurality of memory cells by selecting a word line from said plurality of periodically spaced word lines;
   (c) allowing signals to develop on said plurality of bit lines;
   (d) removing said well potential biasing of step (a) for an interval of time and allowing said array well potential to float during said interval of time, said interval of time overlapping in time signal developing of said step (c); and
   (e) sensing at least one bit line signal on said plurality of bit lines subsequent to said bit line signal development of said step (c).

2. The memory array sensing method of claim 1, further comprising the step of periodically repeating said steps (a)–(e).

3. The memory array sensing method of claim 1, further comprising the step of setting one of a high level signal and a low level signal based upon said bit line signal sensed in said step (e).

4. The memory array sensing method of claim 1, wherein said step (d) occurs simultaneously with said step (c) such that said array well potential floats during all of said bit line signal development of said step (c).

5. The memory array sensing method of claim 1, further comprising the steps of applying an equalizing potential to said plurality of memory cells prior to said row selection step (b), and removing said equalizing potential from said plurality of memory cells subsequent said row selection step (b) such that said plurality of bit lines float.

6. The memory array sensing method of claim 1, wherein said semiconductor memory array comprises a DRAM structure, said memory array sensing method reading the states of selected memory cells.

7. The memory array sensing method of claim 6, wherein said DRAM structure is architected as an open bit line DRAM structure.

8. The memory array sensing method of claim 7, wherein bit lines are paired and said sensing step (e) includes comparing bit line signals on each half of a bit line pair and amplifying any signal difference from said comparison by setting one of a high level signal and a low level signal based thereon.

9. The memory array sensing method of claim 5, wherein said DRAM structure is architected as a folded bit line DRAM structure.

10. In a semiconductor memory array having a plurality of memory cells disposed within an array well, and including a plurality of spaced bit lines for sensing the state of selected memory cells during a predefined bit line signal development period, a method for biasing said array well so as to minimize noise on said bit lines, said method comprising the steps of:
(a) biasing said array well to a desired potential; and
(b) discontinuing said array well biasing of step (a) for an interval of time and allowing said array well potential to float during said interval of time, said interval of time overlapping in time said bit line signal development period.

11. The noise minimization method of claim 10, further comprising the step of resuming biasing of said array well to said desired potential subsequent said bit line signal development period.

12. The noise minimization method of claim 10, wherein said step (b) comprises discontinuing said array well biasing of step (a) for the entire bit line signal development period.

13. A semiconductor memory device comprising:
a plurality of memory cells arranged in rows and columns within an array well;
a plurality of periodically spaced, vertically-extending bit lines for performing column selection of said plurality of memory cells;
a plurality of periodically spaced, horizontally-extending word lines for performing row selection of said plurality of memory cells;
biasing means connected to said well for biasing said well to a desired potential;
a sense amplifier connected to at least some of said plurality of bit lines for sensing the states of corresponding ones of said plurality of memory cells during a bit line signal development period; and
means for disconnecting said well biasing means from said array well for an interval of time and for allowing said array well potential to float for said interval of time, said interval of time overlapping in time said bit line signal development period.

14. The semiconductor memory device of claim 13, wherein said disconnecting means comprises a switching mechanism connected between said well biasing means and said array well.

15. The semiconductor memory device of claim 14, wherein said well biasing means comprises a well potential generator and said switching mechanism includes at least one transistor connected between said well potential generator and said array well.

16. The semiconductor memory device of claim 15, further comprising multiple contacts to said array well, said well potential generator being coupled to each of said multiple well contacts, and wherein said switching mechanism includes multiple transistors, each transistor being connected between said well potential generator and one of said multiple well contacts.

17. The semiconductor memory device of claim 16, wherein said multiple transistors comprise multiple MOSFETs.

18. The semiconductor memory device of claim 16, further comprising means for selectively gating said transistors inactive during at least a portion of said bit line signal development period.

19. The semiconductor memory device of claim 13, wherein said device comprises a DRAM structure.

20. The semiconductor memory device of claim 19, wherein said DRAM structure is architected as an open bit line DRAM structure.

21. The semiconductor memory device of claim 20, wherein said DRAM structure is architectured as a folded bit line DRAM structure.

* * * * *